(12) United States Patent
Ngatched Nkouatchah et al.

(10) Patent No.: US 8,972,817 B2
(45) Date of Patent: Mar. 3, 2015

(54) TWO LOW COMPLEXITY DECODING ALGORITHMS FOR LDPC CODES

(76) Inventors: Telex Maglorie Ngatched Nkouatchah, Winnipeg (CA); Attahiru Sule Alfa, Winnipeg (CA); Jun Cai, Winnipeg (CA)

( * ) Notice: Subject to any disclaimer, the term of this patent is extended or adjusted under 35 U.S.C. 154(b) by 124 days.

(21) Appl. No.: 13/486,077

(22) Filed: Jun. 1, 2012

(65) Prior Publication Data
US 2013/0055043 A1    Feb. 28, 2013

Related U.S. Application Data

(60) Provisional application No. 61/525,975, filed on Aug. 22, 2011.

(51) Int. Cl.
| H03M 13/00 | (2006.01) |
| G06F 11/00 | (2006.01) |
| H03M 13/11 | (2006.01) |

(52) U.S. Cl.
CPC ...... *H03M 13/6527* (2013.01); *H03M 13/1117* (2013.01); *H03M 13/1165* (2013.01); *H03M 13/6544* (2013.01); *H03M 13/6577* (2013.01); *H03M 13/658* (2013.01)
USPC .......................................... 714/758; 714/801

(58) Field of Classification Search
CPC .................... H03M 13/1108; H03M 13/1111; H03M 13/1128; H03M 13/116; H03M 13/6513; H03M 13/1102; H03M 13/2957; H03M 13/09; H03M 13/3746; H03M 13/05; H03M 13/1177; H03M 13/41; H03M 13/6393; G11B 2020/1863; G11B 2020/1843; G11B 2020/185; H04B 1/71637; H04B 1/0057; H04L 1/0057

USPC ........ 714/755, 786, 758, 795, 801, 704, 752, 714/800, E11.03, E11.056, 785, 807; 375/262, 341
See application file for complete search history.

(56) References Cited

U.S. PATENT DOCUMENTS

| 7,246,304 | B2 * | 7/2007 | Kim ............................... 714/801 |
| 7,543,212 | B2 * | 6/2009 | Miles et al. .................... 714/752 |
| 7,831,895 | B2 * | 11/2010 | Lin ............................... 714/800 |
| 8,046,657 | B2 * | 10/2011 | Johannesson et al. ........ 714/752 |
| 8,069,390 | B2 * | 11/2011 | Lin ............................... 714/758 |
| 8,139,512 | B2 * | 3/2012 | Charbit et al. ................ 370/279 |

* cited by examiner

*Primary Examiner* — Phung M Chung
(74) *Attorney, Agent, or Firm* — Ryan W. Dupuis; Kyle R. Satterthwaite; Ade & Company, Inc (57) ABSTRACT

In the present invention, two improved variants of the reliability-based iterative majority-logic decoding algorithm for regular low-density parity-check (LDPC) codes are presented. The new algorithms are obtained by introducing a different reliability measure for each check-sum of the parity-check matrix, and taking it into account in the computation of the extrinsic information that is used to update the reliability measure of each received bit in each iteration. In contrast to the first algorithm, the second algorithm includes check reliability that changes at each iteration. For the tested random and structured LDPC codes, both algorithms, while requiring very little additional computational complexities, achieve a considerable error performance gain over the standard one. More importantly, for short and medium block length LDPC codes of relatively large column weight, both algorithms outperform or perform just as well as the iterative decoding based on belief propagation (IDBP) with less decoding complexity.

12 Claims, 9 Drawing Sheets

TWO LOW COMPLEXITY DECODING ALGORITHMS FOR LDPC CODES

This application claims the benefit under 35 U.S.C. 119(e) of U.S. provisional application Ser. No. 61/525,975, filed Aug. 22, 2011.

I. FIELD OF THE INVENTION

The invention relates to the field of error correction codes (ECC), and more particularly to decoding low-density parity-check LDPC codes. Two algorithms for decoding an encoded data block are described. The algorithms proposed in this invention can be used in modern wireless communication systems, magnetic storage systems and solid-state drive systems.

II. BACKGROUND

The purpose of any communication system is to provide the framework which allows the transmission of information from an information source to a destination via a communication channel. To improve performance, coverage, and efficiency, modern communication systems utilize digital signaling techniques. In general, the information is randomly distorted during transmission as a result of a variety of possible factors. Among these factors are attenuation, nonlinearities, bandwidth limitations, multipath propagation, and noise. Depending on the type and the degree of such distortions, the transmitted information may be received incorrectly. In a digital system, this translates to an abundance of bit errors. If these bit errors go unchecked, then the system would become practically useless. The goal of the designer of a digital communication system is thus to provide a cost-effective facility which improves the reliability and quality of such transmission systems.

At an acceptable data rate, one method of improving the error performance between two users is to increase the power of the transmitted signal. In such cases, the receiver can more easily determine the content of the communicated message. However, there can be substantial costs which motivate the need to consider other methods of improving communications. One cost is the resulting interference to other users within a system, for the case of multiuser system. While the intended target receives the message more easily, the amplified message may interfere with the communications between other users. Another cost is that, in the case of a mobile user, expending too much power on signal transmission will result in a shorter battery life. In addition, each transmitter has a limitation on its average power.

With digital signaling, an alternative way to mitigate the effects of channel distortion is to use error-control coding. Error-control coding for data integrity may be exercised by means of forward error correction (FEC). Essentially, by introducing structural redundancy in the data stream, the receiver can reduce its susceptibility to channel distortion. Hence, to achieve the same performance criteria, error-control coding can provide several decibels (dB) of signal-to-noise ratio (SNR) gain over uncoded systems. It has been said that each decibel is worth one million dollars. In some cases, the gain of error control coding over the uncoded case can exceed 8 decibels.

The approach to error correction coding taken by modern digital communication systems started in the late 1940's with the ground breaking work of Shannon, Hamming, and Golay. In his paper, Shannon set forth the theoretical basis for coding which has come to be known as information theory. By mathematically defining the entropy of an information source and the capacity of a communications channel, he showed that it was possible to achieve reliable communications over a noisy channel provided that the source's entropy is lower than the channel's capacity. In other words, Shannon proved that every noisy channel has a maximum rate at which information may be transferred through it and that it is possible to design error-correcting codes that approach this capacity, or Shannon limit, provided that the codes may be unbounded in length. This came as a surprise to the communications community which at the time thought it impossible to achieve both arbitrarily small error probability and a nonzero data transmission rate. Shannon did not explicitly state how to design codes. For the last six decades, the construction of capacity-approaching coding schemes that are easy to encode and decode has been the supreme goal of coding research. Various types of coding schemes have been used over the years for error correction purposes. In the last decade, a breakthrough was made in this field with the discovery of some practical codes and decoding algorithms which approach considerably the ultimate channel capacity limit. There are two large classes of such codes; Turbo codes and low-density-parity (LDPC) codes.

Turbo codes are obtained by parallel or serial concatenation of two or more component codes with interleavers between the encoders. The component codes are mainly simple convolutional codes. Therefore, it is easy to construct and encode turbo codes. As mentioned, an interleaver is required to permute the input information sequence. It is shown that the larger the interleaver size, the better the performance of turbo codes. On the other hand, large interleaver causes large decoding delay. In decoding of a turbo code, each component code is decoded with a trellis based algorithm. Therefore, for practical implementations, only codes with simple trellises can be used as component codes of turbo codes. However, codes with simple trellises normally have small minimum distances, causing the error floor at medium to high SNR. In turbo decoding, at each decoding iteration the reliability values and estimates are obtained only for the information bits. Thus no error detection can be performed to stop the decoding iteration process. The only way to stop the decoding is to test the decoding convergence, which is usually complex. No error detection results in poor block error rate and slow termination of iterative decoding.

LDPC codes are block codes and were discovered by Gallager in early 1960's. After their discovery, they were ignored for a long time and rediscovered recently. It has been proved that LDPC codes are good, in the sense that sequences of codes exist which, when optimally decoded, achieve arbitrarily small error probability at nonzero communication rates up to some maximum rate that may be less than the capacity of the given channel. Numerous simulation results showed that long LDPC codes with iterative decoding achieve outstanding performance. Until recently, good LDPC codes were mostly computer generated. Encoding of these computer generated codes is usually very complex due to the lack of understanding their structure. On the other hand, iterative decoding for LDPC codes is not trellis based, and it is not required for LDPC codes to have simple trellises. Thus, their minimum distances are usually better that those of turbo codes. For this reason, LDPC codes usually outperform turbo codes in moderate to high SNR region and exhibit error floor at lower error rates. Another advantage of LDPC codes over turbo codes is that their decoding algorithm provides reliability values and estimates for every code bit at the end of each iteration, enabling error detection. The decoding iteration process is stopped as soon as the estimated sequence is detected as a codeword. Therefore, LDPC codes normally provide better block error performance and faster termination of the iterative decoding.

LDPC codes are becoming the standard for error control for a wide range of applications in many communication and digital storage systems where high reliability is required. Medium-rate LDPC codes are used in standards such as DVB-S2, WiMax (IEEE 802.16e), and wireless LAN (IEEE 802.11n). Furthermore, high-rate LDPC codes have been selected as the channel coding scheme for mmWAve WPAN (IEEE 802.15.3c).

While encoding efficiency and high data rates are important, for an encoding and/or decoding system to be practical for use in a wide range of devices, e.g., consumer devices, it is important that the encoders and/or decoders be capable of being implemented at reasonable cost. Accordingly, the ability to efficiently implement encoding/decoding schemes used for error correction and/or detection purposes, e.g., in terms of hardware costs, can be important.

LDPC codes can be decoded with various decoding methods, ranging from low to high complexity and from reasonably good to very good performance. These decoding methods include hard-decision, soft-decision, and hybrid decoding schemes. From an implementation point of view, hard-decision decoding is the simplest in complexity; however, its simplicity results in a relatively poor performance that can be as far away as a few decibels from that of soft-decision decoding. Soft-decision decoding provides the best performance but requires the highest computational complexity. Hybrid decoding is in between the two extremes and provides a good trade-off between performance and complexity.

Among hybrid decoding algorithms, the soft reliability-based iterative majority-logic decoding (SRBI-MLGD) algorithm offers one of the best trade-off between performance and complexity. The algorithm is designed based on the orthogonal check-sums concept used in the one-step majority-logic-decoding (OSMLGD) algorithm. The decoding function of the SRBI-MLGD algorithm includes some kind of soft reliability measures of received symbols which are improved through decoding iterations. Simulation results show that SRBI-MLGD performs just as well as many variants of weighted bit-flipping (WBF) algorithms and the differential binary message-passing decoding (DBMPD) algorithm, with much less decoding complexity. Furthermore, it has a faster rate of decoding convergence. An important feature of SRBI-MLGD is that it is a binary message-passing algorithm and requires only logical operations and integer additions. This feature significantly simplifies the decoder implementation, as it can be achieved using simple combinational logic circuits. Another feature of SRBI-MLGD is that it allows parallel decoding of all the received symbols in each decoding iteration, which is important to achieve a very high decoding speed. However, the performance of SRBI-MLGD is still far away from that of soft-decision decoding algorithms.

Accordingly, a need exists for a method of decoding LDPC codes with reduced complexity while outperforming soft-decision decoding algorithms in terms of bit-error rate (BER) or frame-error rate (FER) performance. These needs and others are met with the present invention, which overcomes the drawbacks and deficiencies of previously developed LDPC decoding algorithms.

III. SUMMARY OF THE INVENTION

The present invention relates generally to two algorithms for decoding data blocks encoded with low-density-parity (LDPC) codes. More particularly, the invention improves on the SRBI-MLGD algorithm by introducing a reliability measure for each check-sum of the parity-check matrix, and taking it into account in the computation of the extrinsic information that is used to update the reliability measure of each received bit in each iteration. Then the total extrinsic information contributed to each received bit is appropriately normalized to update its reliability measure. The normalization factor is chosen in such a way that the main features of the SRBI-MLGD algorithm are preserved. In contrast to the first algorithm, the second algorithm includes check reliability that changes at each iteration. These modifications, while requiring very little additional computational complexity, results in a considerable performance improvement over the SRBI-MLGD algorithm. Moreover, results better than those of soft-decision decoding algorithms have been obtained for short and medium block length LDPC codes. To the best of the authors knowledge, such results have never been reported. The algorithms of the present invention are particularly well suited for use with LDPC codes with relatively large column weights.

According to one aspect of the present invention there is provided a method of decoding received data blocks comprised of plural bits which are encoded with a low density parity code, the method including:
  iteratively computing the reliability of each received bit associated with the data blocks including associating a reliability measure with each check-sum of the parity-check matrix;
  using the reliability measure associated with each check-sum of the parity-check matrix in computation of total extrinsic information contributed to each received bit in each iteration;
  normalizing the total extrinsic information to update the reliability measure; and
  defining the normalization factor in such a way that it depends only on the quantization interval of the received bits.

The method may include uniformly quantizing the received sequence and defining the reliability measure of the nth received $z_n^{(k)}$ in the kth iteration as $R_n^{(k)}$ and defining the reliability of the nth received bit $z_n^{(k+1)}$ in the (k+1)th iteration as $$R_n^{(k+1)} = R_n^{(k)} + E_n^{(k)},$$

where $$E_n^{(k)} = \sum_{m \in \mathcal{M}(n)} (2e_{m,n}^{(k)} - 1),$$

and $$e_{m,n}^{(k)} = \sum_{j \in \mathcal{N}(m) \setminus n} z_j^{(k)} H_{m,j} \pmod{2}.$$

Preferably the sum $E_n^{(k)}$ is the total extrinsic information contributed to the received bit $z_n^{(k)}$ by all the received bits, excluding $z_n^{(k)}$, that participate in the check-sums in $\mathcal{M}(n)$; and the sum $e_{m,n}^{(k)}$ is the extrinsic information contributed to the received bit $z_n^{(k)}$ by the other received bits that participate in the check-sums $\mathcal{M}(n)$ orthogonal on $z_n^{(k)}$.

The reliability measure of each received bit is preferably updated until either a valid codeword is found or a user-defined maximum number of iterations is reached.

At each iteration k, a tentative hard-decision $z^{(k)}$ may be obtained from $R_n^{(k+1)}$ based on the decision rule for $0 \le n \le N-1$ according to the following:

$$z_n^{(k)} = \begin{cases} 0, & \text{if } R_n^{(k)} \le 0, \\ 1, & \text{if } R_n^{(k)} > 0. \end{cases}$$

The method may further include setting the reliability measure $R_n^{(k+1)}$ of $z_n^{(k+1)}$ to $-(2^b-1)$ or $(2^b-1)$ depending on the sign of $R_n^{(k)}+E_n^{(k)}$ if the magnitude $|R_n^{(k)}+E_n^{(k)}|$ is larger than the quantization range $(2^b-1)$ when updating the reliability measure of the received bit $z^{(k)}$ in each iteration k.

The reliability measure of the mth check on the nth symbol may be defined according to:

$$w_{m,n} = \min_{j \in N(m)\backslash n} \{|q_j|\}.$$

A total extrinsic information contributed to the received bit $z_n^{(k)}$ may be defined as:

$$E_n^{(k)} = \sum_{m \in M(n)} (2e_{m,n}^{(k)} - 1) w_{m,n}.$$

The method may further include normalizing the total extrinsic information contributed to the received bit $z_n^{(k)}$, $E_n^{(k)}$, according to:

$$\bar{E}_n^{(k)} = \left\lfloor \frac{E_n^{(k)}}{\alpha} \right\rfloor.$$

Preferably the reliability measures associated with the check-sums of the parity-check matrix are updated with each iteration.

The reliability measure of the mth check on the nth symbol may be defined according to:

$$w_{m,n} \triangleq \min_{j \in N(m)\backslash n} \{R_n^{(k)}\}.$$

According to a second aspect of the present invention there is provided a method of decoding received data blocks comprised of plural bits which are encoded with a low density parity code, the method including:
  iteratively computing the reliability of each received bit associated with the data blocks including associating a reliability measure with each check-sum of the parity-check matrix;
  using the reliability measure associated with each check-sum of the parity-check matrix in computation of total extrinsic information contributed to each received bit in each iteration;
  normalizing the total extrinsic information to update the reliability measure; and
  defining the normalization factor in such a way that it depends only on the quantization interval of the received bits.
  characterized in that the reliability measures associated with the check-sums of the parity-check matrix are updated with each iteration.

The reliability measure of the mth check on the nth symbol may be defined according to:

$$w_{m,n} \triangleq \min_{j \in N(m)\backslash n} \{R_n^{(k)}\}.$$

IV. BRIEF DESCRIPTION OF THE FIGURES

The present invention is illustrated by ways of example, and not by way of limitation, in the figures of the accompanying drawings and in which like reference numerals refer to similar elements and in which.

V. DETAILED DESCRIPTION

A. Notation and Basic Definitions

A binary LDPC code is completely described by its sparse binary parity-check matrix H. For an (N, K) LDPC code, H has N columns and M≥N−K rows. For a regular LDPC code, H has the following structural properties: (i) every row has weight ρ; (ii) every column has weight γ; (iii) no two rows (or two columns) have more than one 1-component in common; and (iv) both ρ and γ are small compared to the length N of the code. The set of bits that participate in check m is denoted as $\mathcal{N}(m) \triangleq \{n: H_{mn}=1\}$. Similarly, the set of checks in which bit n participates is denoted as $\mathcal{M}(n) \triangleq \{m: H_{mn}=1\}$.

Suppose a binary (N, K) LDPC code is used for error control over a binary-input additive white Gaussian noise (BIAWGN) channel with zero mean and power spectral density $N_0/2$. Assume binary phase-shift-keying (BPSK) signaling with unit energy. A codeword $c=(c_0, c_1, \ldots, c_{N-1}) \in \{GF(2)\}^N$ is mapped into the bipolar sequence $x=(x_0, x_1, \ldots, x_{N-1})$ before its transmission, where $x_n=(2c_n-1)$ with $0 \leq n \leq N-1$. Let $y=(y_0, y_1, \ldots, y_{N-1})$ be the soft-decision received sequence at the output of the receiver matched filter. For $0 \leq n \leq N-1$, $y_n=x_n+v_n$ where $v_n$ is a Gaussian random variable with zero mean and variance $\sigma^2$ independent of $x_n$. Assuming that the AWGN has a power spectral density $N_0/2$, we have $$\sigma^2 = \frac{1}{2RE_b/N_0},$$

where $E_b$ and R denote the energy per information bit and the code rate, respectively. Let the corresponding binary hard-decision of the received sequence be $z^{(0)}=(z_0^{(0)}, z_1^{(0)}, \ldots, z_{N-1}^{(0)})$. For any tentative binary hard-decision z made at the end of each decoding iteration, the syndrome vector is computed as $s=z\cdot H^T$. The log-likelihood ratio (LLR) for each channel output $y_n$, $0 \le n < N$, is denoted as $L_n$. Its absolute value, $|L_n|$, is called the reliability of the initial decision $z_n^{(0)}$. For the AWGN channel, a simple measure of the reliability, $|L_n|$, of a received symbol $y_n$ is its magnitude, $|y_n|$. The larger the magnitude $|y_n|$ is, the larger the reliability of the hard-decision digit $z_n^{(0)}$ is.

B. The Algorithms

Suppose the samples of the received sequence y are symmetrically clipped at a threshold $y_{th}$, and then uniformly quantized in the range $[-y_{th}, y_{th}]$. There are $2^b-1$ quantization intervals, symmetric with respect to the origin. Each quantization interval has a length $\Delta=2_{yth}/(2^b-1)$ and is represented by b bits. For $0 \le n \le N-1$, let $q_n=Q(y_n)$ denote the quantized value of the sample $y_n$ which is an integer representation of one of the $2^b-1$ quantization intervals. The range of $q_n$ is therefore $[-(2^{b-1}-1),+(2^{b-1}-1)]$. If the magnitude $|y_n|$ is larger than the quantization range $(2^b-1)\Delta$, then $q_n$ is set at $-(2^{b-1}-1)$ or $(2^{b-1}-1)$, depending on the sign of $y_n$. The magnitude $|q_n|$ of the quantized sample $q_n$ gives a soft measure of the reliability of the hard-decision received bit $z_n$. The SRBI-MLGD uses $q_n$ as the initial reliability measure of the bit $z_n$ at the beginning of the decoding process and improves it through the decoding iterations. Let $R_n^{(k)}$ denote the reliability of the nth received bit $z_n^{(k)}$ in the kth decoding iteration. The reliability measure of the nth received bit $z_n^{(k+1)}$ in the (k+1)th iteration is given by $$R_n^{(k+1)} = R_n^{(k)} + E_n^{(k)}, \quad (1)$$

where $$E_n^{(k)} = \sum_{m \in M(n)} (2e_{m,n}^{(k)} - 1), \quad (2)$$

and $$e_{m,n}^{(k)} = \sum_{j \in N(m) \setminus n} z_j^{(k)} H_{m,j} \pmod{2}. \quad (3)$$

The sum $E_n^{(k)}$ in (2) is the total extrinsic information contributed to the received bit $z_n^{(k)}$ by all the received bits, excluding $z_n^{(k)}$, that participate in the check-sums in $M(n)$; and the sum $e_{m,n}^{(k)}$ in (2) is the extrinsic information contributed to the received bit $z_n^{(k)}$ by the other received bits participating in the check-sum in $M(n)$ orthogonal on $z_n^{(k)}$.

The SRBI-MLGD algorithm sets the initial reliability $R_n^{(0)}$ of the received bit $z_n^{(0)}$ to $q_n$, with $0 \le n \le N-1$, and keep updating it using (2) until either a valid codeword is found or the user-defined maximum number of iterations is reached. At each iteration k, the tentative hard-decision $z^{(k)}$ is obtained from $R_n^{(k+1)}$ based on the following decision rule: for $0 \le n \le N-1$, $$z_n^{(k)} = \begin{cases} 0, & \text{if } R_n^{(k)} \le 0, \\ 1, & \text{if } R_n^{(k)} > 0. \end{cases} \quad (4)$$

When updating the reliability measure of the received bit $z^{(k)}$ in the kth iteration, if the magnitude $|R_n^{(k)}+E_n^{(k)}|$ is larger than the quantization range $(2^b-1)$, the reliability measure $R_n^{(k+1)}$ of $z_n^{(k+1)}$ is set to $-(2^b-1)$ or $(2^b-1)$, depending on the sign of $R_n^{(k)}+E_n^{(k)}$.

It is important to note that, in the described SRBI-MLGD-algorithm, the reliability measure of a received bit and its extrinsic-information in each iteration are integers. Hence the updated reliability measure in each iteration is also an integer. As a result, only logical operations and integer additions are required to carry out the SRBI-MLGD-algorithm. To carry out one iteration of the algorithm requires a total of $2\delta+N-M$ logical operations and $\delta$ integer additions, where $\delta=\rho M=\gamma N$.

In the SRBI-MLGD algorithm, the check-sums in $M(n)$ orthogonal on $z_n$ are treated equally. This implicitly assumes that these check-sums have the same reliability. However, this could be true only if the reliabilities of the received symbols were equal. In fact, since the reliabilities of the received symbols are different, the reliabilities of different check-sums are also different. Thus, introducing a reliability measure for each check-sum in $M(n)$, and taking it into account in the computation of the total extrinsic information, $E_n^{(k)}$, can improve the accuracy of the latter and enhance the performance of the SRBI-MLGD algorithm. In consideration of message passing, the reliability measure of a check-sum passed to a symbol should exclude the symbol itself. Therefore the reliability of a check-sum should be defined with respect to a symbol. For $0 \le m \le M-1$ and $0 \le n \le N-1$, define the reliability of the mth check on the nth symbol as follows:

$$w_{m,n} = \min_{j \in N(m) \setminus n} \{|q_j|\}. \quad (5)$$

We define the new total extrinsic information contributed to the received bit $z_n^{(k)}$ as $$E_n^{(k)} = \sum_{m \in M(n)} (2e_{m,n}^{(k)} - 1) w_{m,n}. \quad (6)$$

The standard deviation of samples in $R_n^{(k)}$ and $E_n^{(k)}$ are, however, different. Thus, $E_n^{(k)}$ needs to be normalized to avoid overestimating the extrinsic information. It is well known that overestimating the extrinsic information when using iterative decoding may cause significantly slower average convergence of the decoding process. Let $$\alpha = \left\lfloor \frac{2^{b-1}-1}{y_{th}} \right\rfloor = \left\lfloor \frac{2^{b-1}-1}{\frac{\Delta}{2}(2^b-1)} \right\rfloor \approx \left\lfloor \frac{1}{\Delta} \right\rfloor, \quad (7)$$

the normalized new total extrinsic information contributed to the received bit $z_n^{(k)}$ is defined as $$\overline{E}_n^{(k)} = \left\lfloor \frac{E_n^{(k)}}{\alpha} \right\rfloor. \quad (8)$$

It is important to note that $\overline{E}_n^{(k)}$ is an integer. Clearly $\alpha$, which is an integer, depends only on the quantization interval $\Delta$ and hence does not need to be optimized separately. The optimal value of $\Delta$, which is obtained through simulation, varies for different codes and signal-to-noise ratio (SNR) values. It was, however, observed that $\Delta$ does not change significantly with the SNR values. Hence, for each code, $\Delta$ is optimized for an SNR and kept fixed for all SNRs. Recall that $2^{b-1}-1$ is the maximum reliability measure set for a received bit by quantization and $y_{th}$ is the threshold at which the samples of the received sequence y are symmetrically clipped prior to quantization. Therefore, $\alpha$ is just a normalization constant reflecting the fact that the quantized values, $q_n$, and the samples, $y_n$, have different ranges.

The update of the reliability measure is given by $$R_n^{(k+1)} = R_n^{(k)} + \bar{E}_n^{(k)}. \tag{9}$$

Since the initial reliability measure of a received bit, $R_n^{(0)} = q_n$, is an integer and its extrinsic-information in each iteration, $\bar{E}_n^{(k)}$, is also an integer, the reliability measure of each modified received bit in each iteration, $R_n^{(k)}$, is an integer as well. The different steps of the proposed algorithm, which we call Modified SRBI-MLGD (MSRBI-MLGD), can be summarized as in Algorithm 1.

Algorithm 1
Modified SRBI-MLGD Algorithm I

1: Given the initial reliability $R^{(0)} = q$ and the corresponding binary hard decision $z^{(0)}$, maximum number of outer iterations $k_{max} > 0$, and quantization step $\Delta$;
2: Initialization: Compute $\alpha$. For $0 \leq m \leq M - 1$ and $0 \leq n \leq N - 1$, compute $w_{m,n} \triangleq \min_{j \in N(m) \setminus n} \{|q_j|\}$;

3: Set iteration counter k = 0;
4: repeat
5: For $0 \leq m \leq M - 1$, compute the parity-check sums (syndrome bits) $s_m = \Sigma_{n=0}^{N-1} z_n^{(k)} H_{mn}$ (mod. 2). If all the parity-check sums are zero, stop the decoding;
6: For $0 \leq n \leq N - 1$, compute: $E_n^{(k)} = \Sigma_{m \in M(n)} (2e_{m,n}^{(k)} - 1) w_{m,n}$, and update the reliability measures of all the received bits in $z^{(k)}$, $R_n^{(k+1)} = R_n^{(k)} + \bar{E}_n^{(k)}$, where $\bar{E}_n^{(k)} = \left\lfloor \frac{E_n^{(k)}}{\alpha} \right\rfloor$;

7: $k \leftarrow k + 1$. Form the tentative hard-decision $z^{(k)}$ based on the following decision rule: for $0 \leq n \leq N - 1$, $$z_n^{(k)} = \begin{cases} 0, & \text{if } R_n^{(k)} \leq 0, \\ 1, & \text{if } R_n^{(k)} > 0; \end{cases}$$

Figure 8:
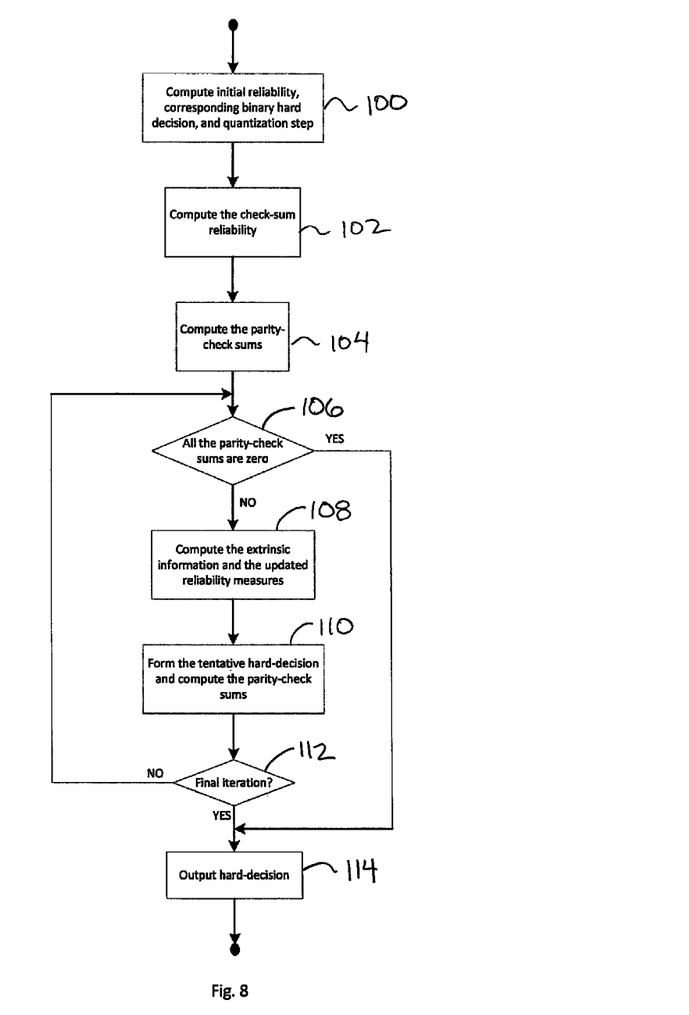
FIG. 8 is a flow chart illustrating the steps of the first decoding algorithm according to the present invention.

8: until all the parity-check sums are zero or the maximum number of iteration is reached;
9: Ouput $z^{(k)}$ as the decoded codeword;

With reference to FIG. 8, the above algorithm begins with computing the initial reliability, corresponding binary hard decision, and quantization step at step 100, followed by computation of the check-sum reliability at step 102. The parity-check sums are then computed at step 104. If all of the parity-check sums are zero at step 106, the decoding stops and a hard-decision is output at step 114. If not, the algorithm then computes the extrinsic information and the updated reliability measures at step 108, followed by formation of the tentative hard-decision and computation of the parity-check sums at step 110. Steps 106 to 110 are repeated until a final iteration is determined at step 112 leading to the hard-decision being output at step 114.

It should be noted that the proposed algorithm preserves all the main features of the SRBI-MLGD. It is a binary message-passing algorithm, and allows parallel decoding of all the received symbols in each iteration.

Since the reliability of each bit changes after every iteration, the check reliability should also change after every iteration. The reliability of the mth check on the nth symbol can be defined for each iteration as follows:

$$w_{m,n} = \min_{j \in N(m) \setminus n} \{R_n^{(k)}\}. \tag{10}$$

The different steps of the proposed algorithm, which includes check reliability that changes at each iteration, can be summarized as in Algorithm 2.

Algorithm 2
Modified SRBI-MLGD Algorithm II

1: Given the initial reliability $R^{(0)} = q$ and the corresponding binary hard decision $z^{(0)}$, maximum number of outer iterations $k_{max} > 0$, and quantization step $\Delta$;
2: Initialization: Compute $\alpha$.
3: Set iteration counter k = 0;
4: repeat
5: For $0 \leq m \leq M - 1$, compute the parity-check sums (syndrome bits) $s_m = \Sigma_{n=0}^{N-1} z_n^{(k)} H_{mn}$ (mod. 2). If all the parity-check sums are zero, stop the decoding;
6: For $0 \leq m \leq M - 1$ and $0 \leq n \leq N - 1$, compute $w_{m,n} \triangleq \min_{j \in N(m) \setminus n} \{R_n^{(k)}\}$;

7: For $0 \leq n \leq N - 1$, compute: $E_n^{(k)} = \Sigma_{m \in M(n)} (2e_{m,n}^{(k)} - 1) w_{m,n}$, and update the reliability measures of all the received bits in $z^{(k)}$, $R_n^{(k+1)} = R_n^{(k)} + \bar{E}_n^{(k)}$, where $\bar{E}_n^{(k)} = \left\lfloor \frac{E_n^{(k)}}{\alpha} \right\rfloor$;

8: $k \leftarrow k + 1$. Form the tentative hard-decision $z^{(k)}$ based on the following decision rule: for $0 \leq n \leq N - 1$, $$z_n^{(k)} = \begin{cases} 0, & \text{if } R_n^{(k)} \leq 0, \\ 1, & \text{if } R_n^{(k)} > 0; \end{cases}$$

Figure 9:
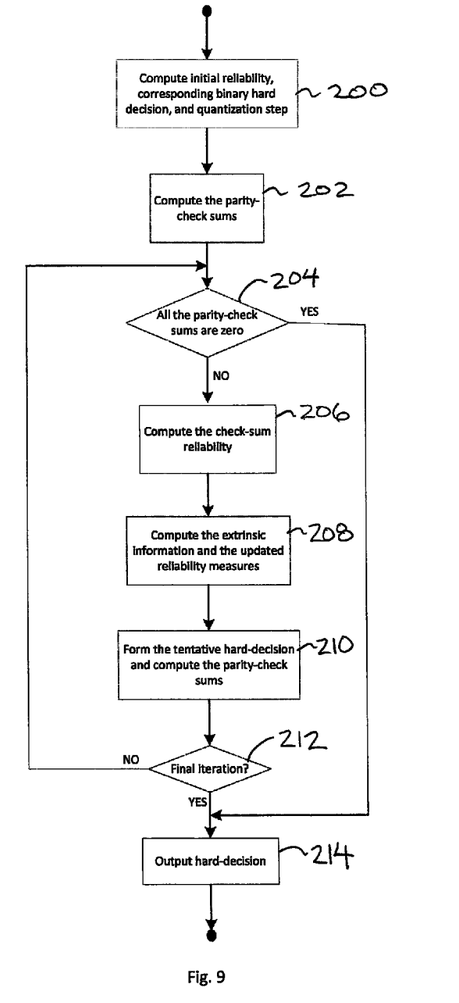
FIG. 9 is a flow chart illustrating the steps of the second decoding algorithm according to the present invention.

9: until all the parity-check sums are zero or the maximum number of iteration is reached;
10: Output $z^{(k)}$ as the decoded codeword;

With reference to FIG. 9, the above algorithm begins with computing the initial reliability, corresponding binary hard decision, and quantization step at step 200, followed by computation of the check-sum reliability at step 202. If all of the parity-check sums are zero at step 204, the decoding stops and a hard-decision is output at step 214. If not, the algorithm then computes the check-sum reliability at step 206. The algorithm then computes the extrinsic information and the updated reliability measures at step 208, followed by formation of the tentative hard-decision and computation of the parity-check sums at step 210. Steps 206 to 210 are repeated until a final iteration is determined at step 212 leading to the hard-decision being output at step 214.

C. Computational Complexities

From the above description, one can find that compared with the standard algorithm, Algorithm I requires $3M\rho - 3M = 3(\delta - M)$ more integer comparisons to compute the weighting coefficients $w_{m,n}$ and one integer division to compute the normalization factor $\alpha$ in the initialization part, $(\gamma - 1) N$ integer additions to compute the extrinsic information, and N integer divisions. Ignoring the cost of the computation of the weighting coefficients $w_{m,n}$ and the normalization factor $\alpha$, since it is done only once at the initialization stage, one iteration of Algorithm I requires a total of $2\delta + N - M$ logical operations, $(\gamma - 1) N$ integer additions, and N integer divisions. Thus the cost per iteration of Algorithm I is slightly higher than that of the standard algorithm. The slight increase in complexity of SRBI-MLGD however is outweighed by a considerable improvement in performance as will be illustrated in the next section.

For Algorithm II, the cost of the computation of the weighting coefficients $w_{m,n}$ can no longer

TABLE I

| Decoding Algorithm | Computation Cost per Iteration | | | | | | | |
|---|---|---|---|---|---|---|---|---|
| | BO | IA | ID | IC | RA | RC | RM | log |
| Algorithm II | $2\delta + N - M$ | $(\gamma - 1) N$ | N | $3 (\delta - M)$ | | | | |
| Algorithm I | $2\delta + N - M$ | $(\gamma - 1) N$ | N | | | | | |
| SRBI-MLGD | $2\delta + N - M$ | $\delta$ | | | | | | |
| IWBF | $\delta + M$ | | | | $\delta$ | $2\delta$ | N | |
| IDBP | $\delta - M$ | | | | $2\delta$ | | $6\delta$ | N |

BO: Binary Operation;
IA: Integer Addition;
ID: Integer Division;
IC: Integer Comparison;
RA: Real Addition;
RC: Real Comparison;
RM: Real Multiplication;
log: Logarithm.

be ignored as it is done at each iteration. Thus, one iteration of Algorithm II requires a total of $2\delta+N-M$ logical operations, $(\gamma-1)$ N integer additions, $3 (\delta-M)$ integer comparisons, and N integer divisions. Therefore, the cost per iteration of Algorithm II is slightly higher than that of Algorithm I, and hence of SRBI-MLGD. As will be illustrated in the next section, for LDPC codes of low column weight, this slight increase is also outweighed by a considerable improvement in performance. The computational complexities per iteration of Algorithm I, Algorithm II, the IDBP, the SRBI-MLGD algorithm, and the improved modified weighted bit-flipping (IMWBF) are given in Table I.

D. Some Results

Using Monte Carlo simulations, the error performance in terms of bit-error rate (BER) and frame-error rate (FER) as a function of the rate-normalized SNR per information bit, of the proposed algorithms is compared with that of the standard SRBI-MLGD on a number of structured and unstructured LDPC codes of various constructions with short to medium block lengths. Eight different codes ($C_1, C_2, C_3, \ldots, C_8$) were studied and are listed in Table II. However, for the sake of brevity, we only present a couple of graphs. The results for the other codes are summarized in Table III. For comparison, the performance of the codes using IDBP is also included. For the Euclidean geometry (EG)-LDPC codes, the performance using the improved modified weighted bit-flipping (IMWBF) is also simulated. The IMWBF is one of the best performing variant of the WBF algorithm for FG-LDPC codes in terms of error performance.

TABLE II

| Code Type | Code Label | Length (N) | Dimension (K) | Rate | Parameters | Δ |
|---|---|---|---|---|---|---|
| (EG)-LDPC Code | $C_1$ | 255 | 175 | 0.686 | $\gamma = 16, \rho = 16$ | 0.0787 |
| | $C_2$ | 1023 | 781 | 0.763 | $\gamma = 32, \rho = 32$ | 0.0308 |
| | $C_3$ | 4095 | 3367 | 0.822 | $\gamma = 64, \rho = 64$ | 0.015 |
| (RS)-LDPC Code | $C_4$ | 2048 | 1723 | 0.841 | $\gamma = 6, \rho = 32$ | 0.0775 |
| | $C_5$ | 2048 | 1561 | 0.762 | $\gamma = 12, \rho = 32$ | 0.0645 |
| PEG-LDPC | $C_6$ | 2048 | 1664 | 0.813 | $\gamma = 6, \rho = 32$ | 0.0868 |
| Code | $C_7$ | 504 | 252 | 0.5 | $\gamma = 3, \rho = 6$ | 0.2448 |
| Gallager LDPC Code | $C_8$ | 273 | 191 | 0.7 | $\gamma = 3, \rho = 10$ | 0.2324 |

TABLE III

| Codes | Algorithm II | Algorithm I | IDBP | SRBI-MLGD | IWBF |
|---|---|---|---|---|---|
| | SNR at the BER of $10^{-5}$ | | | | |
| $C_1$ | 3.20 | 3.25 | 3.55 | 4.6 | 4.2 |
| $C_3$ | 3.55 | 3.75 | 3.8 | 4.4 | 4.25 |
| $C_4$ | 3.1 | 4.4 | 3.8 | 4.8 | * |
| $C_7$ | 3 | 6.75 | 3.1 | 6.3 | * |
| | Average number of iterations at the BER of $10^{-5}$ | | | | |
| $C_1$ | 3 | 4.2 | 1.5 | 1.3 | 7.2 |
| $C_3$ | 17 | 28 | 5 | 4 | 78 |
| $C_4$ | 13 | 10 | 4.5 | 4 | * |
| $C_7$ | 6.8 | 1.6 | 4.7 | 1.7 | * |

For the proposed algorithms and the standard SRBI-MLGD, we use 8-bit uniform quantization with 255 levels; the quantization step Δ, which is obtained through simulations, is given in Table I for each code. The maximum number of iterations is set to 50 for the proposed algorithms and the SRBI-MLGD, and 200 for IDBP and IMWBF; for $C_1$ it is however set to 100 for the IDBP and IMWBF. At each SNR value, at least 100 codewords errors are detected.

Figure 1:
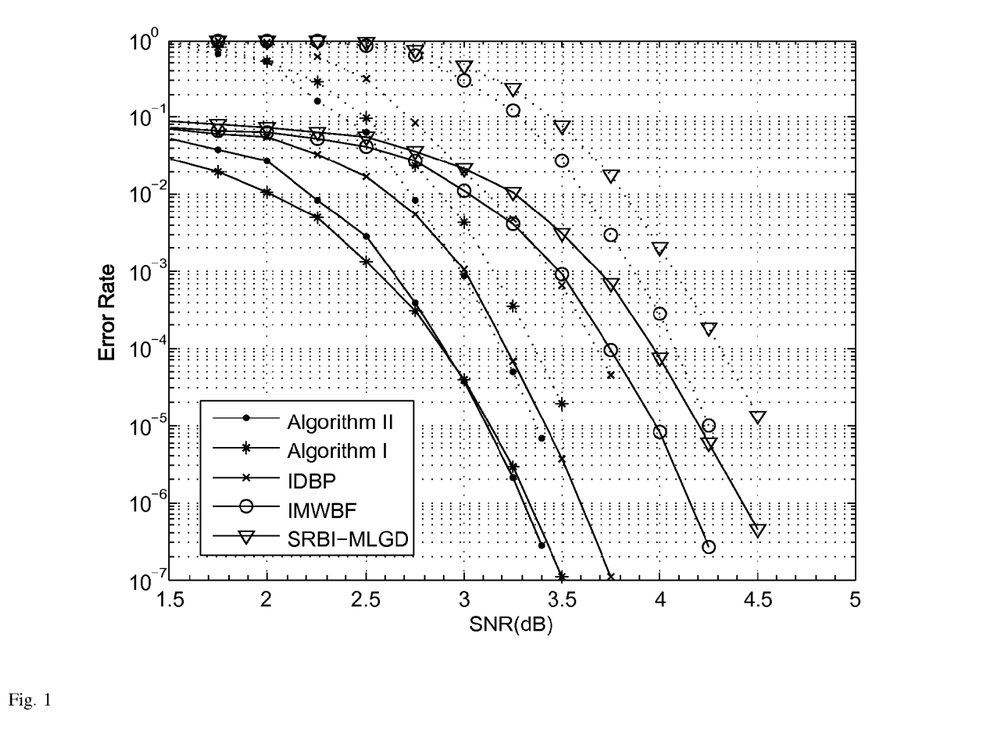
FIG. 1: Simulated BER (solid) and FER (dashed) performances versus rate-normalized SNR of Algorithm II, Algorithm I, IDBP, IMWBF, and SRBI-MLGD for the Type-I 2-D (1023, 781) EG-LDPC code.
Figure 2:
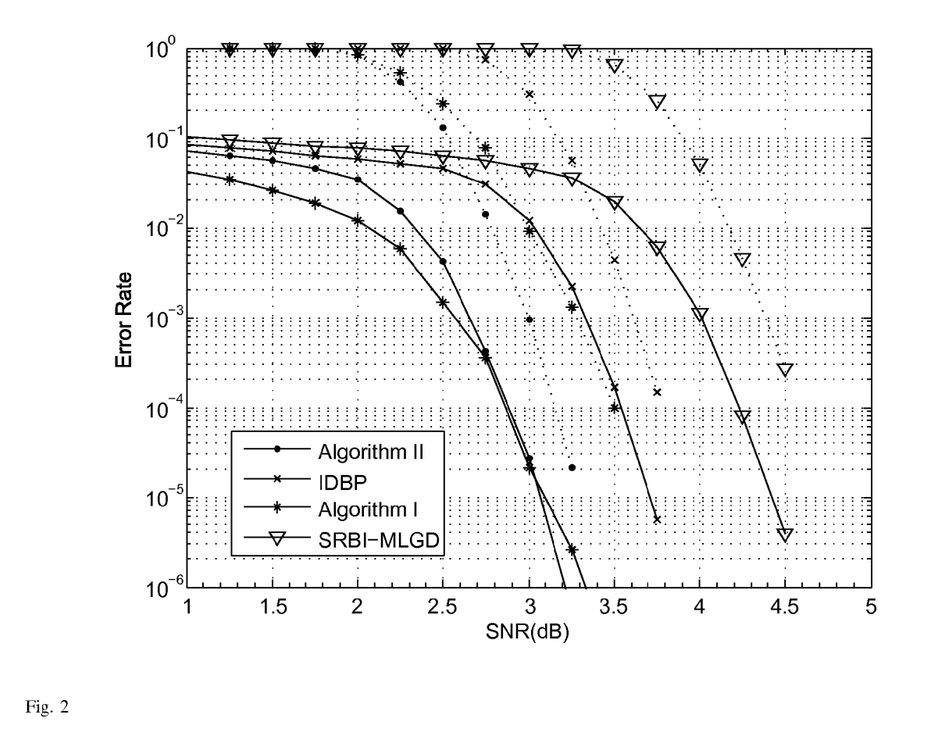
FIG. 2: Simulated BER (solid) and FER (dashed) performances versus rate-normalized SNR of Algorithm II, Algorithm I, IDBP, and SRBI-MLGD for the (2048, 1561) RS-LDPC code.
Figure 3:
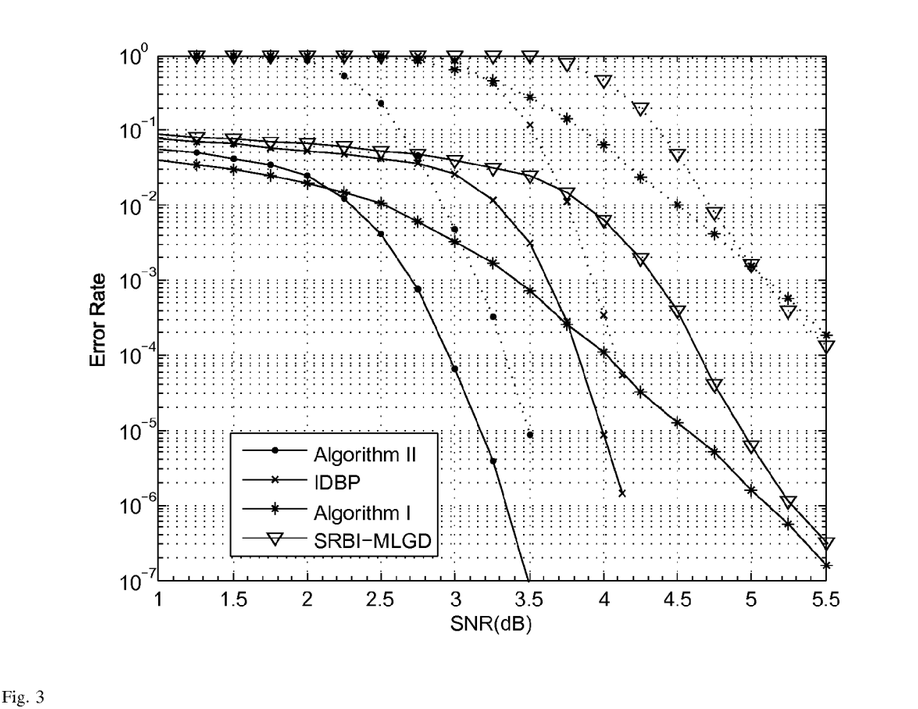
FIG. 3: Simulated BER (solid) and FER (dashed) performances versus rate-normalized SNR of Algorithm II, Algorithm I, IDBP, and SRBI-MLGD for the (2048, 1664) PEG-LDPC code.

FIGS. 1-4 show the BER and FER performances of $C_2$, $C_5$, $C_6$ and $C_8$, respectively. The results for $C_1$, $C_3$, $C_4$, and $C_7$ are summarized in Table III. The following observations can be made:

The SRBI-MLGD algorithm and Algorithm I perform better for LDPC codes with relatively large column weights as illustrated by the performances on $C_1, C_2, C_3$, and $C_5$. This is due to the fact that the range $[-\gamma, +\gamma]$ of the extrinsic information is determined by the column weight γ of the RC-constrained parity-check matrix of an LDPC code. The larger the range of the extrinsic information, the more extrinsic information a received bit can receive from other received bits. At the BER of $10^{-5}$, Algorithm I outperforms the SRBI-MLGD algorithm by about 1.4 dB, 1.1 dB, 0.65 dB, and 1.3 dB for $C_1$, $C_2$, $C_3$, and $C_5$ respectively. The same observation can be made as far as the FER is concerned. Compared to the IMWBF, the improvement in performance is about 0.9 dB, 0.85 dB, and 0.5 dB for $C_1$, $C_2$, and $C_3$, respectively. It should be noted that the Algorithm I requires less computational complexity than the IMWBF algorithm. For these codes, there is very little performance improvement of Algorithm II over Algorithm I.

Algorithm I outperforms IDBP by about 0.3 dB for $C_1$ and $C_2$, and 0.6 dB for $C_5$.

For $C_3$, Algorithm I and IDBP perform practically the same at high SNR. This is due to the fact the performance of IDBP becomes optimal as the block length increases. It should be noted that Algorithm I is less complex than IDBP.

Figure 4:
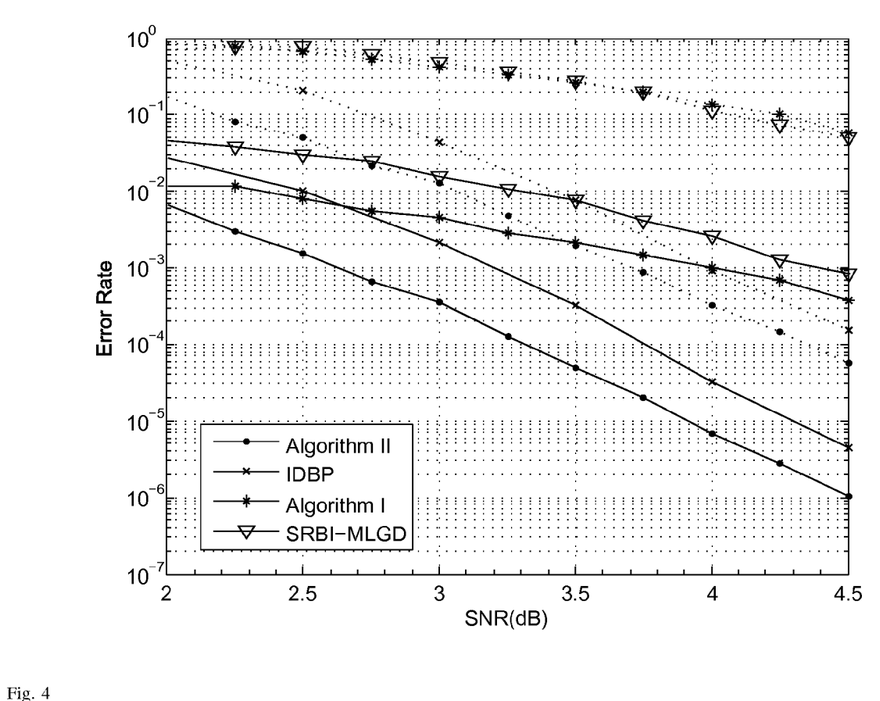
FIG. 4: Simulated BER (solid) and FER (dashed) performances versus rate-normalized SNR of Algorithm II, Algorithm I, IDBP, and SRBI-MLGD for the Gallager (273, 191) LDPC code.

While Algorithm I and the SRBI-MLGD algorithm perform poorly for LDPC codes with low column weight, the performance of Algorithm II is very good even for LDPC codes of column weights as low as γ=3. It can be seen that, at the BER of $10^{-5}$, Algorithm II outperforms IDBP by about 0.7 dB, 0.7 dB, and 0.3 dB for $C_4$, $C_6$, and $C_8$ respectively. For $C_7$, Algorithm II and IDBP perform practically the same at high SNR.

Figure 5:
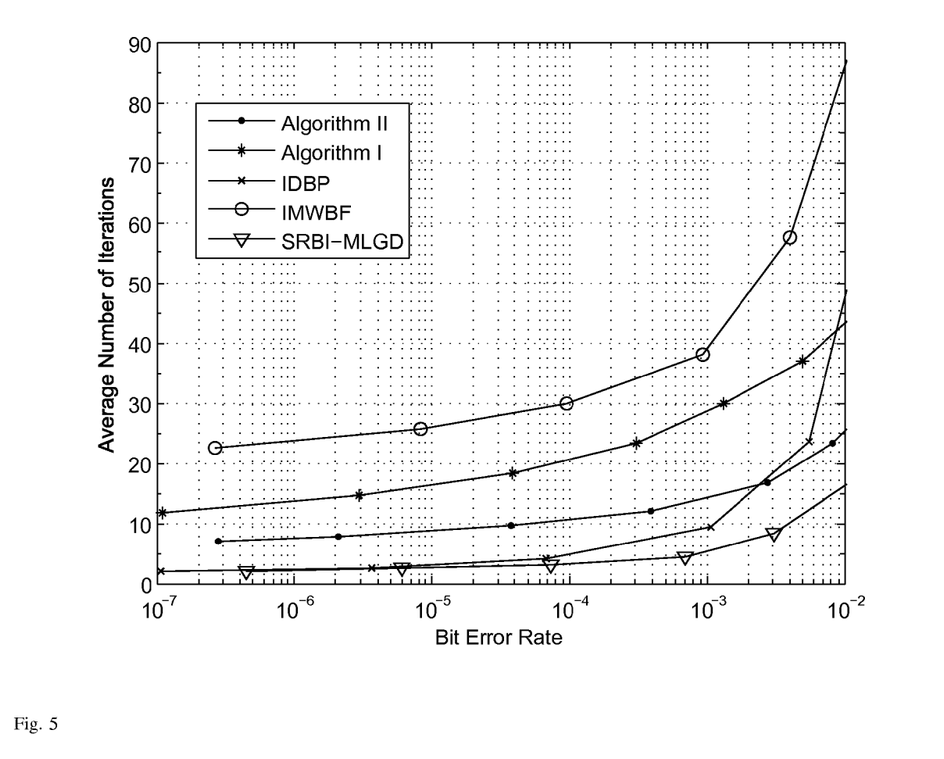
FIG. 5: Average number of iterations versus BER for Algorithm II, Algorithm I, IDBP, IMWBF, and SRBI-MLGD for the Type-I 2-D (1023, 781) EG-LDPC code.
Figure 6:
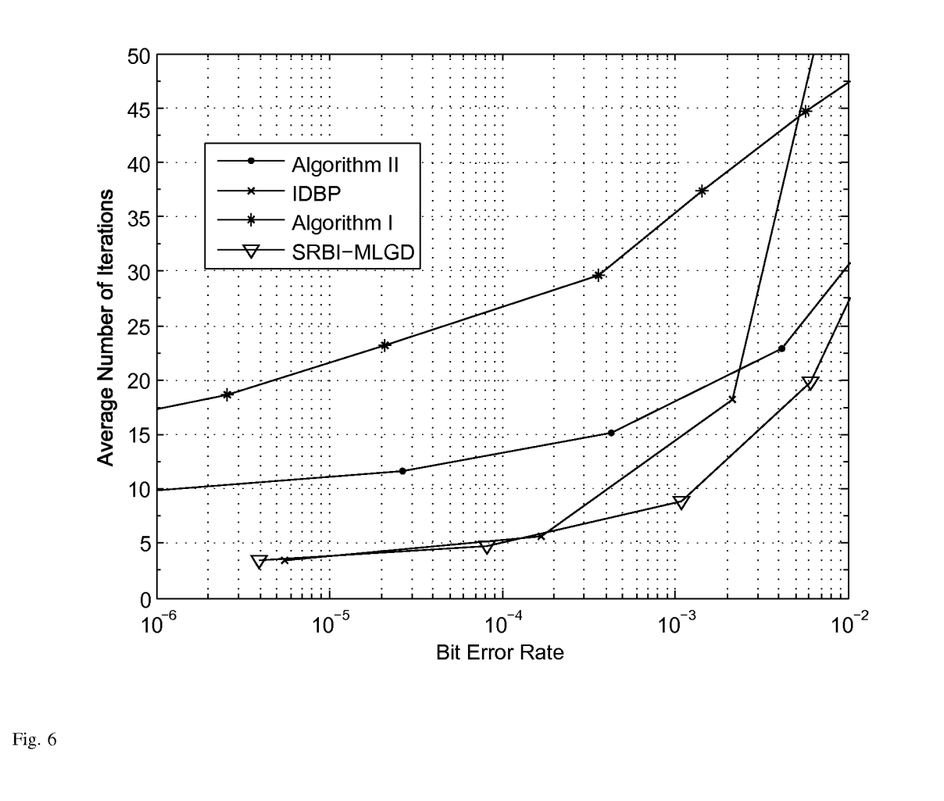
FIG. 6: Average number of iterations versus BER for Algorithm II, Algorithm I, IDBP, and SRBI-MLGD for the (2048, 1561) RS-LDPC code.
Figure 7:
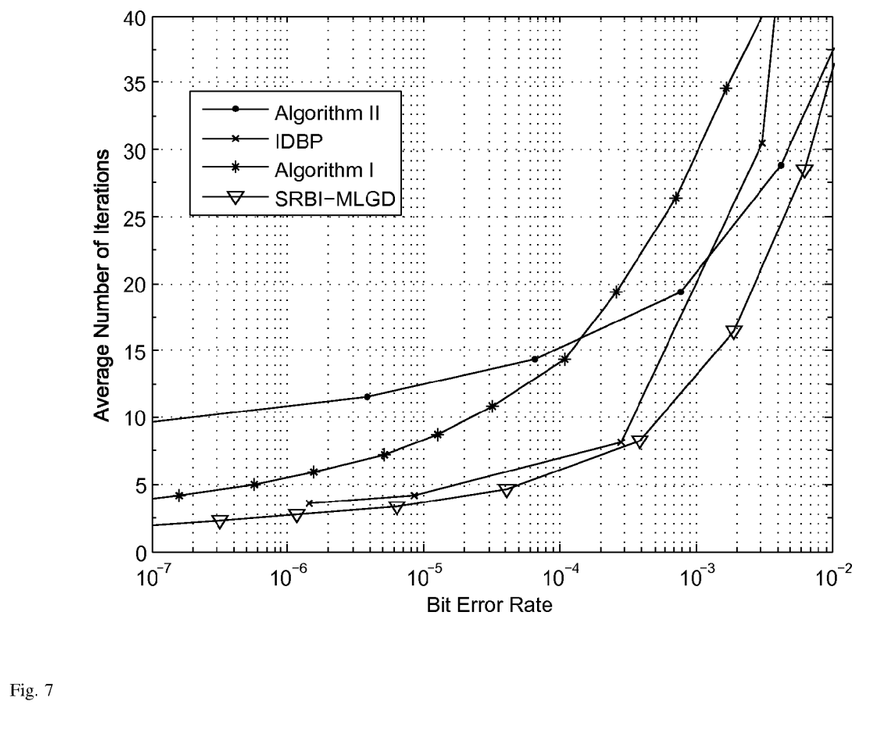
FIG. 7: Average number of iterations versus BER for Algorithm II, Algorithm I, IDBP, and SRBI-MLGD for the (2048, 1664) PEG-LDPC code.

With these performance studies in mind, we move on to the average number of iterations comparison. FIGS. 5-7 depict the average number of iterations for $C_2$, $C_5$, and $C_6$, respectively. This number is closely related to the BER after decoding, and therefore, it is plotted against the BER after decoding rather than against the SNR. We see that, Algorithm II converges much faster than Algorithm I for LDPC codes of relatively large column weights. However, for LDPC codes of low column weights and at high SNR, the situation is reversed with Algorithm II converging slightly slower than Algorithm I. It can also be observed that, in all cases, The SRBI-MLGD algorithm and IDBP converge faster.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method of receiving information at a destination in which the information has been encoded at an information source into data blocks comprised of a plurality of bits in a sequence which are encoded with a low density parity code, the method comprising:
   receiving at the destination the encoded data blocks transmitted from the information source; and
   decoding the encoded data blocks received at the destination by:
      iteratively computing a reliability of each of the plurality bits of the data blocks using a parity-check matrix of check-sums including associating a reliability measure with each check-sum of the parity-check matrix;
      using the reliability measure associated with each check-sum of the parity-check matrix in computation of total extrinsic information contributed to each of the plurality of bits in each iteration;
      normalizing the total extrinsic information to update the reliability measure; and
      defining a normalization factor such that the normalization factor depends only on a quantization interval of the plurality of bits.

2. The method according to claim 1 including uniformly quantizing the sequence and defining a reliability measure of a nth received bit $z_n^{(k)}$ in a nth iteration as $R_n^{(k)}$ and defining a reliability of a nth received bit $z_n^{(k+1)}$ in the (k+1)th iteration as $$R_n^{(k+1)} = R_n^{(k)} + E_n^{(k)},$$

where $$E_n^{(k)} = \sum_{m \in \mathcal{M}(n)} (2e_{m,n}^{(k)} - 1),$$

and $$e_{m,n}^{(k)} = \sum_{j \in \mathcal{N}(m)\backslash n} z_j^{(k)} H_{m,j} \pmod{2}.$$

in which $z_l^{(k)}$ is the lth received bit in the kth iteration, $H_{m,j}$ is the element of the mth row and jth column of the parity-check matrix of the code, $\mathcal{M}(n)$ is the set of checks in which bit n of the received sequence participates, and $\mathcal{N}(m)\backslash n$ is the set $\mathcal{N}(m)$ with bit n excluded.

3. The method according to claim 2 wherein the sum $E_n^{(k)}$ is the total extrinsic information contributed to the received bit $z_n^{(k)}$ by all the received bits, excluding $z_n^{(k)}$, that participate in check-sums in $\mathcal{M}(n)$; and the sum $e_{m,n}^{(k)}$ is the extrinsic information contributed to the received bit $z_n^{(k)}$ by the other received bits that participate in the check-sums $\mathcal{M}(n)$ orthogonal on $z_n^{(k)}$.

4. The method according to claim 1 including updating the reliability measure of each received bit until either a valid codeword is found or a user-defined maximum number of iterations is reached.

5. The method according to claim 1 including at each iteration k, obtaining a tentative hard-decision $z^{(k)}$ from $R_n^{(k+1)}$ based on a decision rule for $0 \leq n \leq N-1$ according to the following:

$$z_n^{(k)} = \begin{cases} 0, & \text{if } R_n^{(k)} \leq 0, \\ 1, & \text{if } R_n^{(k)} > 0. \end{cases}$$

in which $R_n^{(k)}$ is the reliability measure of the nth received bit $z_n^{(k)}$ in the kth iteration, and $R_n^{(k+1)}$ is the reliability of the nth received bit $z_n^{(k+1)}$ in the (k+1)th iteration.

6. The method according to claim 1 including setting a reliability measure $R_n^{(k+1)}$ of $z_n^{(k+1)}$ to $-(2^b-1)$ or $(2^b-1)$ depending on a sign of $R_n^{(k)} + E_n^{(k)}$ if a magnitude $|R_n^{(k)} + E_n^{(k)}|$ is larger than a quantization range $(2^b-1)$ when updating the reliability measure of a received bit $z^{(k)}$ in each iteration k in which $z_n^{(k+1)}$ is the nth received bit in the (k+1)th iteration, b is the number of bits used in the quantization, $R_n^{(k)}$ is the reliability measure of the nth received bit $z_n^{(k)}$ in the kth iteration, and $E_n^{(k)}$ is the total extrinsic information contributed to the received bit $z_n^{(k)}$ by all the received bits, excluding $z_n^{(k)}$, that participate in the check-sums in $\mathcal{M}(n)$.

7. The method according to claim 1 including defining the reliability measure of a mth check on a nth symbol according to:

$$w_{m,n} = \min_{j \in \mathcal{N}(m)\backslash n} \{|q_j|\}$$

in which $\mathcal{N}(m)\backslash n$ is the set $\mathcal{N}(m)$ with bit n excluded and $q_j$ is the quantized value of the jth received sample, and $\mathcal{N}(m)$ is the set of bits that participate in check m of the parity-check matrix.

8. The method according to claim 7 including defining a total extrinsic information contributed to a received bit $z_n^{(k)}$ as:

$$E_n^{(k)} = \sum_{m \in \mathcal{M}(n)} (2e_{m,n}^{(k)} - 1) w_{m,n}$$

in which $\mathcal{M}(n)$ is the set of checks in which bit n of the received sequence participates, $e_{m,n}^{(k)}$ is the extrinsic information contributed to the received bit $z_n^{(k)}$ by the other received bits that participate in the check-sums $\mathcal{M}(n)$ orthogonal on $z_n^{(k)}$, and $w_{m,n}$ is the reliability measure of the mth check on the nth symbol.

9. The method according to claim 8 including ((normalizing the total extrinsic information contributed to the received bit $z_n^{(k)}$, $E_n^{(k)}$, according to:

$$\overline{E}_n^{(k)} = \left\lfloor \frac{E_n^{(k)}}{\alpha} \right\rfloor$$

in which $\overline{E}_n^{(k)}$ is the normalized total extrinsic information contributed to the received bit $z_n^{(k)}$ by all the received bits, excluding $z_n^{(k)}$, that participate in the check-sums in $\mathcal{M}(n)$, $E_n^{(k)}$ is the total extrinsic information contributed to the received bit $z_n^{(k)}$ by all the received bits, excluding $z_n^{(k)}$, that participate in the check-sums in $\mathcal{M}(n)$, and $\alpha$ is the normalization factor.

10. The method according to claim 9 including computing a normalization factor $\alpha$ according to:

$$\alpha \approx \left\lfloor \frac{1}{\Delta} \right\rfloor$$

in which $\Delta$ is the length of the quantization interval.

11. A method of receiving information at a destination in which the information has been encoded at an information source into data blocks comprised of a plurality of bits in a sequence which are encoded with a low density parity code, the method comprising:
   receiving at the destination the encoded data blocks transmitted from the information source; and
   decoding the encoded data blocks received at the destination by:
      iteratively computing a reliability of each of the plurality of bits of the data blocks using a parity-check matrix of check-sums including associating a reliability measure with each check-sum of the parity-check matrix;
      using the reliability measure associated with each check-sum of the parity-check matrix in computation of total extrinsic information contributed to each of the plurality of bits in each iteration;
      normalizing the total extrinsic information to update the reliability measure;
      defining a normalization factor such that the normalization factor depends only on a quantization interval of the plurality of bits; and
      updating the reliability measures associated with the check-sums of the parity check matrix with each iteration.

12. The method according to claim 11 including defining the reliability measure of a mth check on a nth symbol according to:

$$w_{m,n} \triangleq \min_{j \in \mathcal{N}(m)\backslash n} \{R_n^{(k)}\}$$

in which $\mathcal{N}(m)\backslash n$ is the set $\mathcal{N}(m)$ with bit n excluded and $q_j$ is the quantized value of the jth received sample, and $\mathcal{N}(m)$ is the set of bits that participate in check m of the parity-check matrix.

* * * * *